US007928008B2

(12) United States Patent
Jang et al.

(10) Patent No.: US 7,928,008 B2
(45) Date of Patent: Apr. 19, 2011

(54) METHOD FOR FABRICATING SEMICONDUCTOR DEVICE

(75) Inventors: Taek-Yong Jang, Suwon-si (KR); Byung-Il Lee, Seongnam-si (KR); Young-Ho Lee, yongin-si (KR); Seok-Pil Jang, Suwon-si (KR)

(73) Assignee: Terasemicon Corporation, Hwaseong-si (KR)

( * ) Notice: Subject to any disclaimer, the term of this patent is extended or adjusted under 35 U.S.C. 154(b) by 88 days.

(21) Appl. No.: 12/523,306

(22) PCT Filed: Jan. 18, 2008

(86) PCT No.: PCT/KR2008/000340
§ 371 (c)(1),
(2), (4) Date: Jul. 15, 2009

(87) PCT Pub. No.: WO2008/088199
PCT Pub. Date: Jul. 24, 2008

(65) Prior Publication Data
US 2010/0035429 A1    Feb. 11, 2010

(30) Foreign Application Priority Data

Jan. 18, 2007  (KR) .................. 10-2007-0005514
Feb. 5, 2007   (KR) .................. 10-2007-0011375

(51) Int. Cl.
*H01L 21/768*   (2006.01)

(52) U.S. Cl. ........ 438/647; 438/660; 438/672; 438/675; 438/684; 257/377; 257/520; 257/E21.585; 257/E21.593

(58) Field of Classification Search .................. 438/368, 438/645, 647, 655, 660, 672, 675, 682, 684; 257/377, 382, 385, 520, 588, E21.577, E21.585, E21.586, E21.627, E21.641
See application file for complete search history.

(56) References Cited

U.S. PATENT DOCUMENTS

| 4,272,880 | A | * | 6/1981  | Pashley ............... 438/153 |
| 4,727,045 | A | * | 2/1988  | Cheung et al. ........ 438/384 |
| 5,041,884 | A | * | 8/1991  | Kumamoto et al. ..... 257/347 |
| 5,128,732 | A | * | 7/1992  | Sugahara et al. ...... 257/353 |
| 5,534,460 | A | * | 7/1996  | Tseng et al. .......... 438/672 |
| 5,587,338 | A | * | 12/1996 | Tseng ................. 438/672 |
| 5,599,736 | A | * | 2/1997  | Tseng ................. 438/659 |
| 5,624,863 | A | * | 4/1997  | Helm et al. ........... 438/210 |

(Continued)

FOREIGN PATENT DOCUMENTS

KR    1998-056170    9/1998
(Continued)

*Primary Examiner* — David Vu
*Assistant Examiner* — Earl N Taylor
(74) *Attorney, Agent, or Firm* — Mannava & Kang, P.C.

(57) ABSTRACT

A fabricating method of a polysilicon layer is disclosed which can be applied for fabricating a semiconductor device such as a SRAM and so on. The method for fabricating the semiconductor device includes the steps of: forming a transistor included in the semiconductor device on a semi conductor substrate forming an insulating layer on the transistor; forming contact holes, through which a region of the transistor is exposed, by selectively removing the insulating layer forming a silicon layer in the contact holes forming a metal layer on the insulating layer and the silicon layer; forming a metal suicide layer through heat treatment of the silicon layer and the metal layer; removing the metal layer; forming an amorphous silicon layer on the insulating layer and the metal suicide layer; and forming a polysilicon layer through heat treatment of the amorphous silicon layer.

15 Claims, 4 Drawing Sheets

U.S. PATENT DOCUMENTS

| | | | | |
|---|---|---|---|---|
| 5,670,812 | A * | 9/1997 | Adler et al. | 257/347 |
| 5,804,470 | A * | 9/1998 | Wollesen | 438/141 |
| 6,172,381 | B1 * | 1/2001 | Gardner et al. | 257/67 |
| 6,259,118 | B1 * | 7/2001 | Kadosh et al. | 257/67 |
| 6,358,828 | B1 * | 3/2002 | Kadosh et al. | 438/586 |
| 6,429,484 | B1 * | 8/2002 | Yu | 257/347 |
| 6,596,573 | B2 | 7/2003 | Lee | |
| 6,600,173 | B2 * | 7/2003 | Tiwari | 257/74 |
| 6,607,949 | B2 | 8/2003 | Kim | |
| 6,635,552 | B1 * | 10/2003 | Gonzalez | 438/455 |
| 6,638,834 | B2 * | 10/2003 | Gonzalez | 438/455 |
| 6,815,267 | B2 | 11/2004 | So | |
| 6,887,753 | B2 * | 5/2005 | Gonzalez | 438/253 |
| 6,927,431 | B2 * | 8/2005 | Gonzalez | 257/288 |
| 6,964,896 | B2 * | 11/2005 | Gonzalez | 438/241 |
| 7,067,909 | B2 * | 6/2006 | Reif et al. | 257/686 |
| 7,115,451 | B2 * | 10/2006 | Gonzalez | 438/157 |
| 7,151,041 | B2 * | 12/2006 | Gonzalez | 438/406 |
| 7,250,680 | B2 * | 7/2007 | Gonzalez | 257/755 |
| 7,312,487 | B2 * | 12/2007 | Alam et al. | 257/278 |
| 7,326,960 | B2 * | 2/2008 | Gonzalez | 257/67 |
| 2002/0036351 | A1 * | 3/2002 | Suh et al. | 257/774 |
| 2003/0059999 | A1 * | 3/2003 | Gonzalez | 438/200 |
| 2003/0077858 | A1 * | 4/2003 | Lian et al. | 438/240 |
| 2003/0173654 | A1 * | 9/2003 | Rodgers et al. | 257/659 |
| 2004/0266206 | A1 * | 12/2004 | Cleeves | 438/719 |
| 2005/0287793 | A1 * | 12/2005 | Blanchet et al. | 438/629 |
| 2006/0071074 | A1 * | 4/2006 | Konevecki et al. | 235/454 |

FOREIGN PATENT DOCUMENTS

| | | |
|---|---|---|
| KR | 10-2005-37783 A | 4/2005 |
| KR | 10-2005-117132 A | 12/2005 |
| KR | 0130380 B1 | 4/2008 |

* cited by examiner

METHOD FOR FABRICATING SEMICONDUCTOR DEVICE

TECHNICAL FIELD

The present invention relates to a method for fabricating semiconductor device, more specifically, to a method capable of facilitating the crystallization of amorphous silicon film by using metal catalyst at the time when a polysilicon layer used as a TFT channel of a SRAM device is fabricated.

BACKGROUND ART

A RAM is used for storing programs or data created by a user, and is classified as an SRAM and a DRAM. The SRAM is a random access memory which has memory cell(s) operating in a flip-flop way, and it is usually used for a low capacity memory or a cache memory because it keeps memorizing the contents stored therein without a complicated refresh clock as long as a power supply is provided. The speed of the SRAM is rapider than that of the DRAM around 5 times and the SRAM is more expensive than the DRAM. The SRAM includes a flip-flop memory cell which is comprised of four to six MOSFETs and the operation mechanism of the SRAM is same as that of a conventional flip-flop. The power consumption per one bit of the SRAM is lower than that of the DRAM.

The SRAM is classified as a full CMOS cell, a HRL (high resist load) cell and a TFT cell according to a cell structure.

The full CMOS cell is formed with six transistors in its bulk region. The full CMOS cell has merits in that it can be operated in a high speed with a low power consumption, while it has demerits in that a large scale integration is unfavorable.

The HRL cell is comprised of four transistors and two resistances. The HRL cell has merits in that its fabricating process is simple and a large scale integration is favorable, while it has demerits in that it has a high stand-by electric current and a low soft error resistance.

The TFT cell has a structure that a poly TFT is laminated on a MOSFET. The TFT cell has merits in that it has an appropriate stand-by electric current and a large scale integration is favorable, while it has demerits in that it has a high power consumption.

Figure 1:
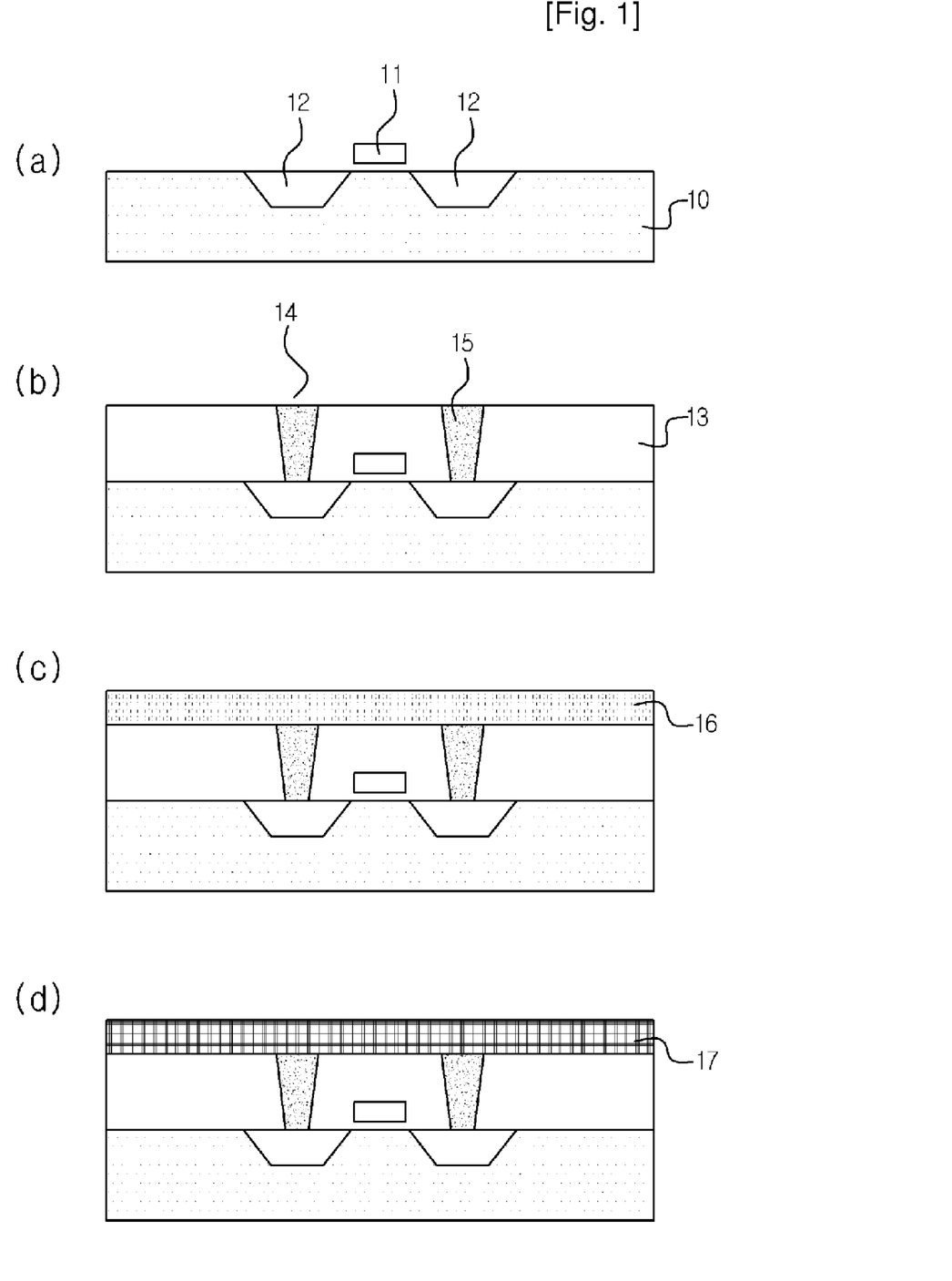
FIG. 1 shows the conventional fabricating method of SRAM.

FIG. 1 illustrates a conventional method for fabricating the SRAM having a TFT cell structure, and a region illustrated in FIG. 1 corresponds to a part of a cell array of the SRAM.

FIG. 1(a) shows a step for forming the MOSFET, which is used in later for laminating poly TFT thereon. The MOSFET is comprised of a gate 11 and a source/drain 12 which is formed on a silicon wafer 10 serving as a semiconductor substrate. The detailed explanation about the formation of the MOSFET is omitted.

FIG. 1(b) shows a step for forming seed layer which is used for fabricating polysilicon. The polysilicon is usually fabricated by crystallizing amorphous silicon by using singlecrystalline silicon as a seed.

First, an interlayer insulating layer 13 is formed on the MOSFET, and then contact holes 14 are formed through the interlayer insulating layer 13, thereby exposing the region of the source/drain 12.

Then, the seed layer, i.e., the singlecrystalline silicon layer 15 is formed in the contact holes 14 by using SEG (selective epitaxial growth) technique. The SEG technique is a sort of a chemical vapor deposition technique, capable of making single-crystalline silicon grow only in the region where silicon is exposed by using gas such as SiH4 and H2 at the temperature over 900° C. That is, singlecrystalline silicon-grows only on the source/drain 12 (because it is made of silicon), which is exposed through the contact holes 14, while it does not grow in the interlayer insulating layer 13.

FIG. 1(c) shows a step for forming an amorphous silicon layer 16 on the interlayer insulating layer 13 and the singlecrystalline silicon layer 15. The amorphous silicon layer 16 may be usually formed by using LPCVD (low pressure chemical vapor deposition) or PECVD (plasma enhanced chemical vapor deposition).

FIG. 1(d) shows a step for forming a polysilicon layer 17 through a heat treatment of the amorphous silicon layer 16, wherein the singlecrystalline siliconlayer 15 functions as a seed for crystallization of the amorphous silicon. Then, the poly TFT is fabricated on the polysiliconlayer 17, resulting in the SRAM. The detailed explanation thereabout is omitted.

DISCLOSURE OF INVENTION

Technical Problem

However, the conventional method as described above has problems as followings:

Firstly, there is a limit in crystallizing the amorphous silicon layer by using the seed. Since the amorphous silicon is subject to the heat treatment for a long time to get the desired crystallization as described above, the productivity of the SRAM is decreased. Of course, if temperature during the heat treatment is increased, the time needed for the heat treatment would be shortened, however, there may be various situations in which the temperature during the heat treatment cannot be increased un-limitedly due to the entire process of the SRAM.

Secondly, the SEG used for forming the singlecrystalline-silicon layer functioning as the seed is a high temperature process as well as an expensive process. As described in the above, since the SEG is applied over 900° C., there is a drawback that the thermal budget of the SRAM is increased. Consequently, the fabricating price of the SRAM is increased because the SEG is basically an expensive process.

Technical Solution

Therefore, the present invention, intended to solve the above-described problems, provides a method capable of fabricating the SRAM with a high productivity and an inexpensive process.

Advantageous Effects

A method for fabricating the semiconductor device in accordance with the present invention makes it possible to decrease the temperature and the time needed for the heat treatment for crystallizing amorphous silicon, and thus the thermal budget in the fabricating process of the SRAM or the DRAM can be reduced and the productivity of the SRAM or the DRAM can be increased. Further, a method for fabricating the SRAM in accordance with the present invention makes it possible to lower the fabricating price of the SRAM because the expensive process needed for forming the seed is unnecessary.

REFERENCE NUMERALS FOR THE PRIMARY
COMPONENTS IN THE DRAWINGS 20, 30: silicon board
21, 31: gate
22, 32: source/drain
23, 33: interlayer insulating layer
24, 34: contact holes
25: silicon layer
26, 35: metal layer
27, 36: metal silicide layer
28, 37: amorphous silicon layer
29, 38: polysilicon layer

BEST MODE FOR CARRYING OUT THE
INVENTION

It is, therefore, one object of the present invention to provide a method for fabricating a semiconductor device including the steps of: forming a transistor included in the semiconductor device on a semiconductor substrate forming an insulating layer on the transistor; forming contact holes, through which a region of the transistor is exposed, by selectively removing the insulating layer forming a silicon layer in the contact holes forming a metal layer on the insulating layer and the silicon layer; forming a metal silicide layer through heat treatment of the silicon layer and the metal layer; removing the metal layer; forming an amorphous silicon layer on the insulating layer and the metal silicide layer; and forming a polysilicon layer through heat treatment of the amorphous silicon layer.

It is, therefore, another object of the present invention to provide a method for fabricating a semiconductor device including the steps of: forming a transistor included in the semiconductor device on a semiconductor substrate forming an insulating layer on the transistor; forming contact holes, through which a silicon layer of the transistor is exposed, by selectively removing the insulating layer forming a metal layer on the insulating layer and in the contact holes forming a metal silicide layer through heat treatment of the metal layer and the silicon layer exposed due to the contact holes removing the metal layer; forming an amorphous silicon layer on the insulating layer and in the contact holes and forming a polysilicon layer through heat treatment of the amorphous silicon layer.

The metal layer includes at least one metal among Ni, Al, Ti, Ag, Au, Co, Sb, Pd and Cu.

Further, the metal layer is formed by chemical vapor deposition.

Still further, the metal layer is formed by atomic layer deposition.

Still further, the thickness of the metal layer depends on the thickness of the amorphous silicon layer.

Further, in the step of forming the metal silicide layer, a temperature during the heat treatment is 250~500° C., a time needed for the heat treatment is 30~60 min, and an atmosphere needed for the heat treatment is an inert gaseous atmosphere.

Still further, the metal layer is removed by SPM (sulfuric peroxide mixture) solution.

Still further, in the step of forming the polysilicon layer, a temperature during the heat treatment is 400~700° C., a time needed for the heat treatment is 1~10 hrs, and an atmosphere needed for the heat treatment is an inert gaseous atmosphere.
Mode for the Invention Hereinafter, the constitution of the present invention is described in detail with reference to the attached drawings.

In the method for fabricating the SRAM according to the present invention, the polysiliconlayer is formed with the crystallization temperature being lowered by using metal catalyst. The crystallization method of amorphous silicon using metal catalyst has been adopted in the poly-Si TFT (polysilicon thin film transistor) which corresponds to the driving device of flat panel display such as LCD. The most important process in fabricating the poly-Si TFT is the crystallization of amorphous silicon at a low temperature, wherein it is desirable to decrease the crystallization temperature. For the this, various processes have been proposed wherein the polysiliconcan be formed at a low temperature rapidly, among which a method gathers attention which induces the crystallization at a low temperature by applying metal catalyst such as Ni, Cu and Al to the amorphous silicon.

Thus, the inventors of the present invention noticed that the method of crystallization of amorphous silicon using metal catalyst when fabricating the poly-Si TFT of LCD can be also applied when fabricating the poly-Si TFT of SRAM, hence the present invention have been invented. That is, when crystallizing the amorphous silicon in order to make the poly-Si TFT of SRAM, the use of metal catalyst makes it possible to lower the crystallization temperature of the amorphous silicon, and thus the time needed for the heat treatment can be decreased under the identical heat treatment condition, so that the productivity of the SRAM is increased. In addition, since the crystallization of amorphous silicon is possible without using the seed, the expensive SEG process needs not be used, so that the fabricating price of the SRAM is decreased.

Figure 2:
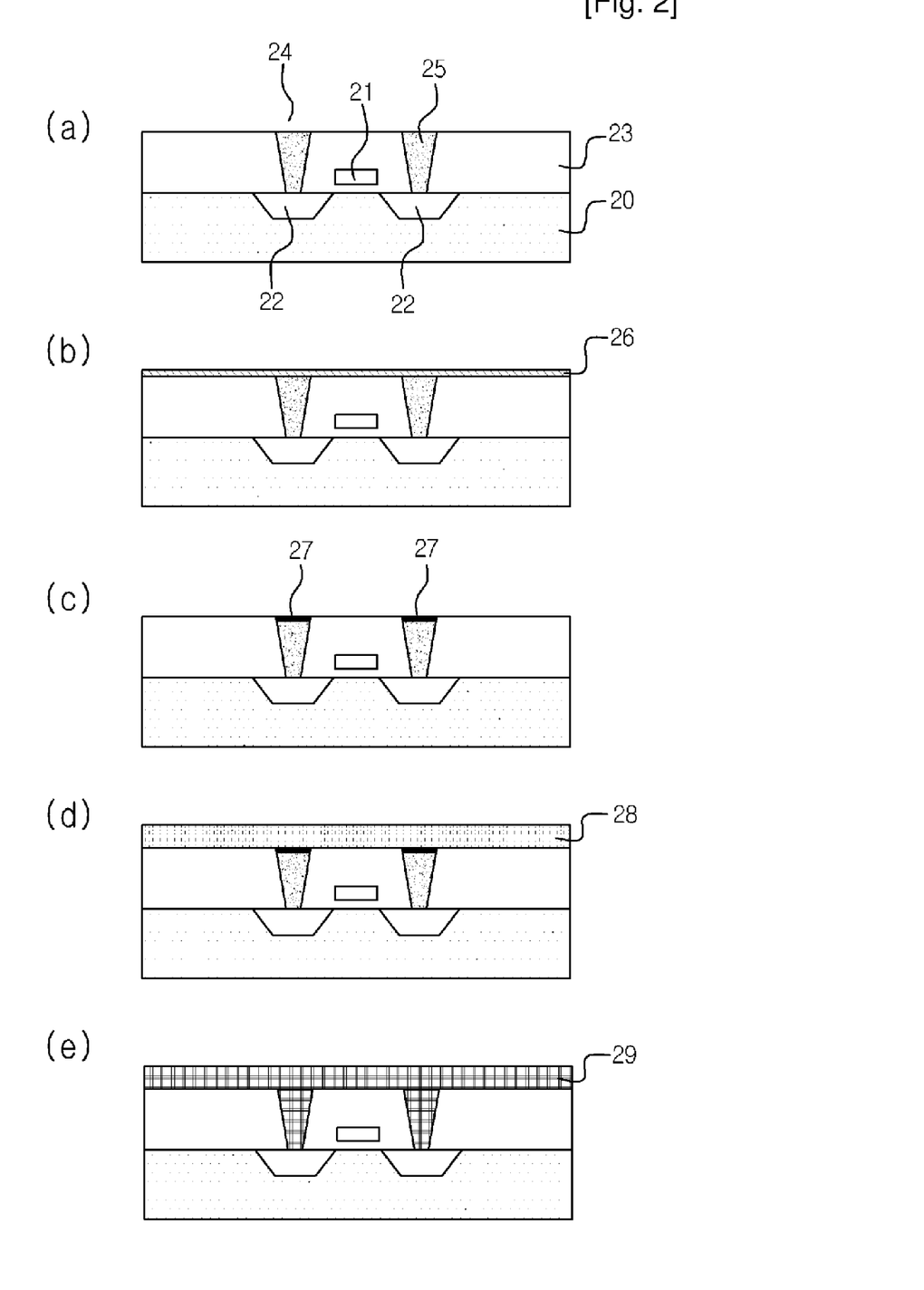
FIG. 2 shows the fabricating method of SRAM in accordance with a first embodiment of the present invention.

FIG. 2 illustrates a fabricating method of SRAM in accordance with a first embodiment of the present invention. As similar with FIG. 1, a region illustrated in FIG. 2 corresponds to a part of a cell array of the SRAM.

Since the step of FIG. 2(a) is the same as the steps of FIGS. 1(a) and 1(b), its detail is not described here except that the present embodiment does not use the seed, and thus that there is no need to form the singlecrystalline silicon layer in the contact holes 24. That is, in the present embodiment, such a silicon layer 25 as amorphous silicon layer or polysilicon layer is formed in the contact holes 24. In this regard, since it is impossible to form the silicon layer 25 selectively only in the contact holes 24 due to the deposition mechanism of silicon layer, the silicon layer formed on the interlayer insulating layer 23 should be removed through etch back process, CMP(chemical mechanical polishing) process and so on. The step for removing the silicon layer 25 formed on the interlayer insulating layer 23 could be omitted if a singlecrystalline silicon layer is formed in the contact holes 24 by using the SEG, like FIG. 1(a). However, the use of SEG results in a problem that the fabricating price of the SRAM is increased.

FIG. 2(b) shows a step for forming a metal layer 26 which is used as a catalyst on the interlayer insulating layer 23 and the silicon layer 25. The metal layer 26 includes at least one metal among Ni, Al, Ti, Ag, Au, Co, Sb, Pd and Cu. However, it is desirable to use Ni considering the entire fabricating process of the SRAM. Although forming method of the metal layer 26 is not specified, it is desirable to use the method conventionally used in fabricating semiconductor device.

The thickness of the metal layer 26 depends on the thickness of an amorphous silicon layer 28 to be formed in the step of FIG. 2(d). The thicker the amorphous silicon layer 28 gets, the thicker gets the metal layer 26 which is necessary. In case the thickness of the metal layer 26 is needed to be finely controlled, it is desirable to use chemical vapor deposition in forming the metal layer 26.

Meanwhile, in the present invention, the usage of metal catalyst has merits in that it is possible to crystallize the amorphous silicon at a low temperature, however, has demerits in that the leakage current of the SRAM is highly increased because considerable amount of metal is included in the active region of the poly-Si TFT. Therefore, in order to prevent the metal contamination of the poly-Si TFT, it is necessary to reduce the amount of the applied metal catalyst as long as possible. For this, the thickness of the metal layer 26 might be controlled by one atomic layer, wherein it is desirable to use ALD (atomic layer deposition) technique in forming the metal layer 26. In this regard, the expression that the thickness of the metal layer 26 might be controlled by one atomic layer means not only that an atomic layer of metal is continuously deposited on the entire area of the silicon layer 25 (that is, covering rate=1), but also that an atomic layer of metal is discontinuously deposited on the entire area of the silicon layer 25 (that is, covering rate<1). Of course, other methods besides ALD technique can be used which can control the thickness of the metal layer by one atomic layer.

FIG. 2(*c*) shows a step for forming a metal silicide layer 27 on the silicon layer 25 through heat treatment of the silicon layer 25 and the metal layer 26, wherein it is desirable that a temperature during the heat treatment is 250~500° C., a time needed for the heat treatment is 30~60 min, and an atmosphere needed for the heat treatment is an inert gaseous atmosphere such as Ar, Ne, He and N2. Then, the metal layer 26 on the interlayer insulating layer 23 is removed where metal-silicide reaction did not occur. The metal layer 26 can be removed by wet etching technique. For example, SPM (sulfuric peroxide mixture) solution can remove the metal layer 26 on the interlayer insulating layer 23.

FIG. 2(*d*) shows a step for forming an amorphous silicon layer 28. The thickness of the amorphous layer is desirably 1,000~2,000 Å. As described in the above, LPCVD or PECVD is usually adopted in forming the amorphous silicon layer 28.

FIG. 2(*e*) shows a step for forming a polysilicon layer 29 through the heat treatment of the amorphous silicon layer 28. During the step of FIG. 2(*e*), the amorphous silicon layer 25 in the contact holes 24 is also crystallized to the polysilicon layer 29. At this time, the metal silicide formed in the step of FIG. 2(*c*) is served as the catalyst of the crystallization. That is, during the heat treatment, as the metal silicide diffuses within the amorphous silicon layer 28, the amorphous silicon is crystallized to be the polysilicon.

In the present invention, a temperature during the heat treatment is desirably 400~700° C., wherein in case the temperature is too low, it must be considered that the productivity (throughput) of the SRAM is decreased because a time needed for the crystallization is increased, while in case the temperature is too high, it must be considered that the thermal budget of the SRAM is increased. The time needed for the heat treatment is decided depending on the temperature during the heat treatment.

In the present invention, the time needed for the heat treatment is desirably 1~10 hours, wherein in case the time is too short, the crystallinity of the polysilicon is worsened, while in case the time is too long, the productivity of the SRAM is decreased.

Considering all the above-described matters, it is desirable to crystallize the amorphous silicon through heat treatment for around three hours or more at the temperature of 550° C., or for around one hour or more at the temperature of 600° C. Of course, the time need for the heat treatment can be changed a little according to the distance between the contact holes.

In the present invention, an atmosphere needed for the heat treatment is desirably inert gaseous atmosphere such as Ar, Ne, He and N2.

Figure 3:
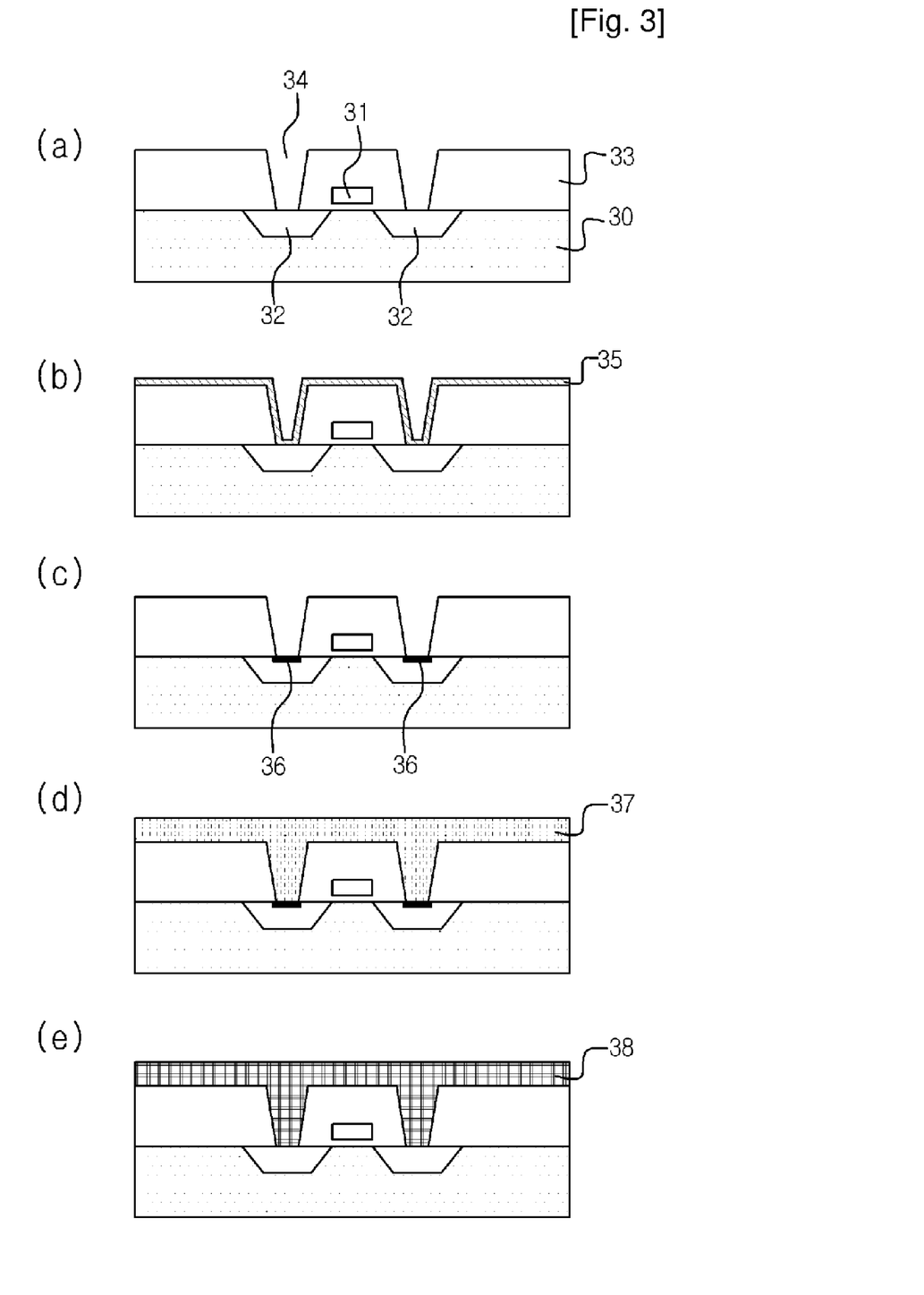
FIG. 3 shows the fabricating method of SRAM in accordance with a second embodiment of the present invention.

FIG. 3 illustrates a fabricating method of SRAM in accordance with a second embodiment of the present invention.

FIG. 3(*a*) shows a step for forming an interlayer insulating layer 33 and contact holes 34 after the MOSFET of the SRAM is fabricated. Unlike FIG. 1(*b*), the single-crystalline silicon layer is not formed in the present embodiment which is served as the seed.

FIG. 3(*b*) shows a step for forming a metal layer 35 on the interlayer insulating layer 33 and in the contact holes 34. All the description regarding this step is the same as that of the first embodiment [refer to the description of FIG. 2(*b*)].

FIG. 3(*c*) shows a step for forming a metal silicide layer 36 on source/drain 32 by heat treatment of the silicon layer exposed through the contact holes 34 (that is, source/drain 32) and the metal layer 35. All the description regarding this step is the same as that of the first embodiment [refer to the description of FIG. 2(*c*)].

FIG. 3(*d*) shows a step for forming an amorphous silicon layer 37 on the interlayer insulating layer 33 and in the contact holes 34. All the description regarding this step is the same as that of the first embodiment [refer to the description of FIG. 2(*d*)].

FIG. 3(*e*) shows a step for forming a polysilicon layer 38 through the heat treatment of the amorphous silicon layer 37. All the description regarding this step is the same as that of the first embodiment [refer to the description of FIG. 2(*e*)].

In the above, the method according to the present invention is described as an example of SRAM which has a poly-Si TFT cell structure. However, the method according to the present invention can be applied to a case where a poly-Si TFT is included as a component in a semiconductor device, besides the SRAM.

In addition, the method according to the present invention can be applied to fabrication process of various semiconductor devices besides the above described matters. In particular, the present invention can be applied to a case where a polysilicon wiring layer is used in a semiconductor device instead of a metal wiring layer. Generally, the wiring of the semiconductor device can be classified as the metal wiring and the polysilicon wiring. The polysilicon wiring has demerits in that it has higher resistivity than the metal wiring. However, the polysilicon wiring has merits in that its fabricating process such as deposition and etching of wiring is easier than that of the metal wiring, so that it can be easily applied to fabricate integrated circuits, for example, a DRAM. Thus, the polysilicon wiring is widely used in a bit line of the DRAM and so on.

Figure 4:
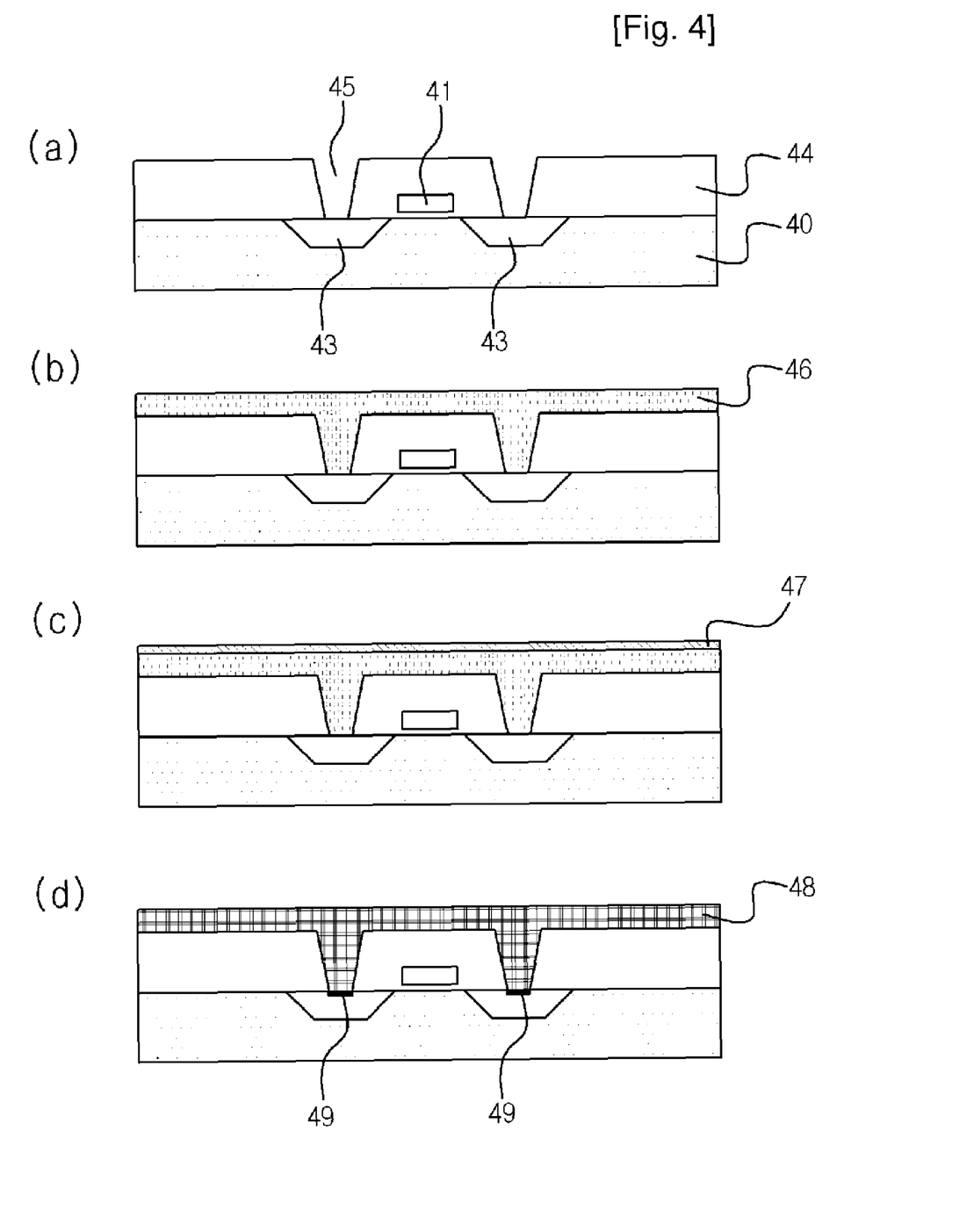
FIG. 4 shows the fabricating method of DRAM in accordance with the present invention.

FIG. 4 illustrates a fabricating method of DRAM in accordance with the present invention. A region illustrated in FIG. 4 corresponds to a part of a cell array of the DRAM.

First, as illustrated, FIG. 4(*a*) shows a semiconductor device before the wiring formation is started. A MOSFET is comprised of a gate 41, a source 42 and a drain 43 which is formed on a silicon wafer 40 serving as a semiconductor substrate. An interlayer insulating layer 44 is formed on the MOSFET. Then, contact holes 45 are formed in the interlayer insulating layer 44 which expose a predetermined region of the source 42 and the drain 43 for electric connection.

FIG. 4(*b*) shows a step for forming an amorphous silicon layer 46 which is doped on the interlayer insulating layer 44 and in the contact holes 45. The method for forming the amorphous silicon layer 46 is desirably LPCVD or PECVD as described in the fabricating method of SRAM in the above.

FIG. 4(*c*) shows a step for forming a metal layer 47 on the doped amorphous silicon layer 46 as a catalyst. The metal layer 47 includes at least one metal among Ni, Al, Ti, Ag, Au, Co, Sb, Pd and Cu. It is desirable to use Ni as the catalyst considering the entire fabricating process of the semiconductor device. The forming method of the metal layer 47 is not limited to specially specified method. However, the conventional method is desirably used which is applied in fabricating the semiconductor device, for instance, PVD (physical vapor deposition) such as thermal evaporation and sputtering, and CVD (chemical vapor deposition) such as LPCVD and PECVD. The thickness of the metal layer 47 depends on the doping concentration and thickness of the amorphous silicon layer 46.

FIG. 4(d) shows a step for forming a polysilicon wiring layer 48 through the heat treatment of the amorphous silicon layer 46. In the present invention, a temperature during the heat treatment is desirably 400~700° C., wherein it must be considered that the productivity (throughput) of the DRAM is decreased because the time needed for the crystallization is increased if the temperature is too low, while it must be considered that the thermal budget of the semiconductor device is increased if the temperature is too high.

The time needed for the heat treatment depends on the temperature during the heat treatment and the doping concentration of the amorphous silicon layer 46. In the present invention, the time needed for the heat treatment is desirably 1~10 hours, wherein it must be considered that the crystallinity of the polysilicon wiring layer is bad if the time is too short, while it must be considered that the productivity of the DRAM is decreased if the time is too long.

In consideration of all the above matters, it is desirable to crystallize the amorphous silicon through heat treatment for around one hour at the temperature of around 600° C. Therefore, according to the present invention, the temperature during the heat treatment and the time needed for the heat treatment in order to form the polysiliconwiring can be decreased a lot in comparison with the conventional method that the polysilicon wiring is formed through SPC (solid phase crystallization) of the amorphous silicon layer.

In the present invention, an atmosphere needed for the heat treatment is desirably inert gaseous atmosphere such as Ar, Ne, He and N2.

In the mean time, in accordance with the present invention, the metal used as the catalyst for crystallizing the amorphous silicon causes the metal silicide layer 49 to be formed in the boundary region between the source 42/drain 43 and the polysilicon wiring layer 48. For example, if Ni is used as the metal catalyst, nickel silicide layer such as NiSi or NiSi2 is formed. Generally, the resistivity of the metal silicide is much lower than that of the polysilicon. Thus, the contact resistance can be decreased a lot between the source 42/drain 43 and the polysilicon wiring layer 48.

Herein the method in accordance with the present invention is described as an example of the DRAM. However, the method can also be applied to all other semiconductor devices such as a flash memory device and a non-memory device, besides the DRAM.

Although the present invention is described by exemplifying the desirable embodiment described in the above, the present invention can be subject to various change and modification by the ordinary-skilled person of the art to which the present invention belongs within the scope of the present invention. Such change and modification should be regarded as falling within the scope of the present invention and the attached claims.

The invention claimed is:

1. A method for fabricating a semiconductor device comprising the steps of:
   forming a transistor included in the semiconductor device on a semiconductor substrate;
   forming an insulating layer on the transistor;
   forming contact holes, through which a region of the transistor is exposed, by selectively removing the insulating layer;
   forming a silicon layer in the contact holes;
   forming a metal layer on the insulating layer and the silicon layer;
   forming a metal silicide layer through heat treatment of the silicon layer and the metal layer;
   removing the metal layer;
   forming an amorphous silicon layer on the insulating layer and the metal silicide layer; and
   forming a polysiliconlayer through heat treatment of the amorphous silicon layer.

2. A method for fabricating a semiconductor device comprising the steps of:
   forming a transistor included in the semiconductor device on a semiconductor substrate;
   forming an insulating layer on the transistor;
   forming contact holes, through which a silicon layer of the transistor is exposed, by selectively removing the insulating layer;
   forming a metal layer on the insulating layer and in the contact holes;
   forming a metal silicide layer through heat treatment of the metal layer and the silicon layer exposed due to the contact holes;
   removing the metal layer;
   forming an amorphous silicon layer on the insulating layer and in the contact holes; and
   forming a polysilicon layer through heat treatment of the amorphous silicon layer.

3. The method for fabricating the semiconductor device of claim 1 or 2, wherein the metal layer includes at least one metal among Ni, Al, Ti, Ag, Au, Co, Sb, Pd and Cu.

4. The method for fabricating the semiconductor device of claim 1 or 2, wherein the metal layer is formed by chemical vapor deposition.

5. The method for fabricating the semiconductor device of claim 4, wherein the metal layer is formed by atomic layer deposition.

6. The method for fabricating device of claim 1 or 2, wherein the thickness of the metal layer is determined by the thickness of the amorphous silicon layer.

7. The method for fabricating the semiconductor device of claim 1 or 2, wherein, at the step of forming the metal silicide layer, a temperature during the heat treatment is 250~500° C., a time needed for the heat treatment is 30~60 min, and an atmosphere needed for the heat treatment is an inert gaseous atmosphere.

8. The method for fabricating the semiconductor device of claim 1 or 2, wherein the metal layer is removed by SPM (sulfuric peroxide mixture) solution.

9. The method for fabricating the semiconductor device of claim 1 or 2, wherein, at the step of forming the polysilicon layer, a temperature during the heat treatment is 400~700° C., a time needed for the heat treatment is 1 ~10 hrs, and the an atmosphere needed for the heat treatment is an inert gaseous atmosphere.

10. A method for fabricating a semiconductor device comprising the steps of:
    forming a transistor included in the semiconductor device on a semiconductor substrate;
    forming an insulating layer on the transistor;
    forming contact holes, through which a silicon layer of the transistor is exposed, by selectively removing the insulating layer;

forming an amorphous silicon layer which is doped on the insulating layer and in the contact holes;

forming a metal layer on the amorphous silicon layer; and forming a polysilicon wiring layer through heat treatment of the amorphous silicon layer.

11. The method for fabricating the semiconductor device of claim 10, wherein the metal layer includes at least one metalamong Ni, Al, Ti, Ag, Au, Co, Sb, Pd and Cu.

12. The method for fabricating the semiconductor device of claim 10, wherein the metal layer is formed by chemical vapor deposition.

13. The method for fabricating the semiconductor device of claim 10, wherein the thickness of the metal layer is determined by the thickness of the amorphous silicon layer.

14. The method for fabricating the semiconductor device of claim 10, wherein, at the step of forming the polysilicon wiring layer through heat treatment, a temperature during the heat treatment is 400~700° C., a time needed for the heat treatment is 1~10 hrs, and an atmosphere needed for the heat treatment is an inert gaseous atmosphere.

15. The method for fabricating the semiconductor device of claim 10, wherein, at the step of forming the polysilicon wiring layer through heat treatment, a metal silicide layer is formed in a boundary region between the polysilicon wiring layer and the silicon layer of the transistor.

* * * * *